(12) United States Patent
Nelson et al.

(10) Patent No.: US 8,432,231 B2
(45) Date of Patent: Apr. 30, 2013

(54) DIGITAL PHASE-LOCKED LOOP CLOCK SYSTEM

(75) Inventors: Reuben Pascal Nelson, Colfax, NC (US); Dan Zhu, High Point, NC (US)

(73) Assignee: Analog Devices, Inc., Norwood, MA (US)

( * ) Notice: Subject to any disclaimer, the term of this patent is extended or adjusted under 35 U.S.C. 154(b) by 205 days.

(21) Appl. No.: 12/908,484

(22) Filed: Oct. 20, 2010

(65) Prior Publication Data

US 2011/0032013 A1 Feb. 10, 2011

Related U.S. Application Data

(63) Continuation-in-part of application No. 12/838,719, filed on Jul. 19, 2010, now Pat. No. 8,188,796.

(51) Int. Cl.
*H03L 7/08* (2006.01)
*H03L 7/099* (2006.01)
*H03L 7/18* (2006.01)

(52) U.S. Cl.
USPC .................. 331/34; 331/14; 331/1 A; 327/156

(58) Field of Classification Search .............. 331/18, 331/25, 34, 1 A; 327/113, 114, 115, 117, 327/156, 147, 159
See application file for complete search history.

(56) References Cited

U.S. PATENT DOCUMENTS

| | | | |
|---|---|---|---|
| 7,046,098 B2 | 5/2006 | Staszewski | |
| 7,295,077 B2 | 11/2007 | Thomsen et al. | |
| 7,385,539 B2 | 6/2008 | Vanselow et al. | |
| 7,436,227 B2 | 10/2008 | Thomsen et al. | |
| 7,579,886 B2 * | 8/2009 | Hufford et al. | 327/156 |
| 8,102,196 B1 * | 1/2012 | Zhang | 327/156 |
| 8,188,796 B2 * | 5/2012 | Zhu et al. | 331/34 |
| 2004/0012423 A1 * | 1/2004 | Maeda | 327/156 |
| 2007/0152757 A1 * | 7/2007 | Sridharan | 331/1 A |
| 2008/0191762 A1 * | 8/2008 | Seethamraju et al. | 327/158 |

OTHER PUBLICATIONS

Quad/Octal Input Network Clock Generator/Synchronizer, AD9548, Analog Devices.
Dual Input Network Clock Generator/Synchronizer, AD9549, Analog Devices.
Any-Rate Precision Clocks Family Reference Manual, Silicon Labs, 2008.

* cited by examiner

*Primary Examiner* — Ryan Johnson
(74) *Attorney, Agent, or Firm* — Kenyon & Kenyon LLP

(57) ABSTRACT

A clock system includes a digital phase/frequency detector (DPFD), a buffer, a digitally-controlled oscillator (DCO) including a sigma-delta modulator (SDM), an adder, a first frequency divider. The DPFD may have a first input for a reference input clock and a second input for a feedback signal, and outputting a difference signal representing a phase and/or frequency difference between the reference input clock and the feedback signal. The first frequency divider may have an input for a clock signal and a control input coupled to the adder. The system clock also may include a phase-locked loop (PLL) including a phase/frequency detector that has a first input coupled to the output of the DCO and a second input that is phase-locked to the first input, and a second frequency divider coupled from the second input of the PLL to the second input of the DPFD.

18 Claims, 11 Drawing Sheets

DIGITAL PHASE-LOCKED LOOP CLOCK SYSTEM

CROSS-REFERENCE TO RELATED APPLICATIONS

The present application is a continuation-in-part application of U.S. patent application Ser. No. 12/838,719 filed Jul. 19, 2010, the content of which is incorporated by reference in its entirety.

FIELD OF THE INVENTION

The present invention is generally directed to a digital clock system that may be used to generate a clock for a circuit system. In particular, the present invention is directed to a clock system that may generate a highly stable and high performing clock using a digital phase-locked loop (DPLL) circuit and a fractional divider based digitally-controlled oscillator (DCO).

BACKGROUND INFORMATION

Digital Phase Locked Loop (DPLL) circuits may be used to generate system clocks. The DPLL may generate a system clock based on a reference input clock. When the DPLL loses the reference input clock during operation, the DPLL operates in a holdover event. Certain systems may require their system clock to perform accurately even in the holdover events. The holdover frequency accuracy may be defined in terms of a maximum fractional frequency offset and drift over a period of time.

Analog Devices Inc., the assignee of the present invention, manufactures integrated circuits that include a direct digital synthesizer (DDS) and a digital-to-analog converter (DAC) to implement a digitally-controlled oscillator within a DPLL. A digital control word may tune the DDS to generate a clock which is converted into an analog sine wave by the DAC. However, the DDS+DAC implementation requires a filter for removing harmonics at the DAC output. The filter cannot easily be fabricated within the integrated circuit in which the DPLL is fabricated, and therefore, it is provided as an external component, which increases cost and complexity of the clock system. Additionally, the DDS+DAC design requires a comparator for converting the sine waves to square waves so that the square waves can be used as a system clock. These extra components occupy additional space and increase cost.

Therefore, there is a need for a highly stable and high performance clock system that is persistent and accurate during holdover events, but consumes less power and costs less.

DETAILED DESCRIPTION OF EXAMPLE EMBODIMENTS

Embodiments of the present invention may provide clock system that may include a digital phase/frequency detector (DPFD), a buffer, a digitally-controlled oscillator (DCO) including a sigma-delta modulator (SDM), an adder, a first frequency divider. The DPFD may have a first input for a reference input clock and a second input for a feedback signal, and outputting a difference signal representing a phase and/or frequency difference between the reference input clock and the feedback signal. The buffer may be coupled to the DPFD for storing the difference signal over time. The sigma-delta modulator (SDM) may have a control input coupled to the buffer. The adder may have inputs coupled to the (SDM) and a source of an integer control word. The first frequency divider may have an input for a clock signal and a control input coupled to the adder, the DCO generating an output clock signal having an average frequency representing a frequency of the input clock signal divided by (N+F/M), in which N is determined by the integer control word and F/M is determined by an output of the SDM. The system clock also may include a phase-locked loop (PLL) including a phase/frequency detector that has a first input coupled to the output of the DCO and a second input that is phase-locked to the first input, and a second frequency divider coupled from the second input of the PLL to second input of the DPFD.

Figure 1:
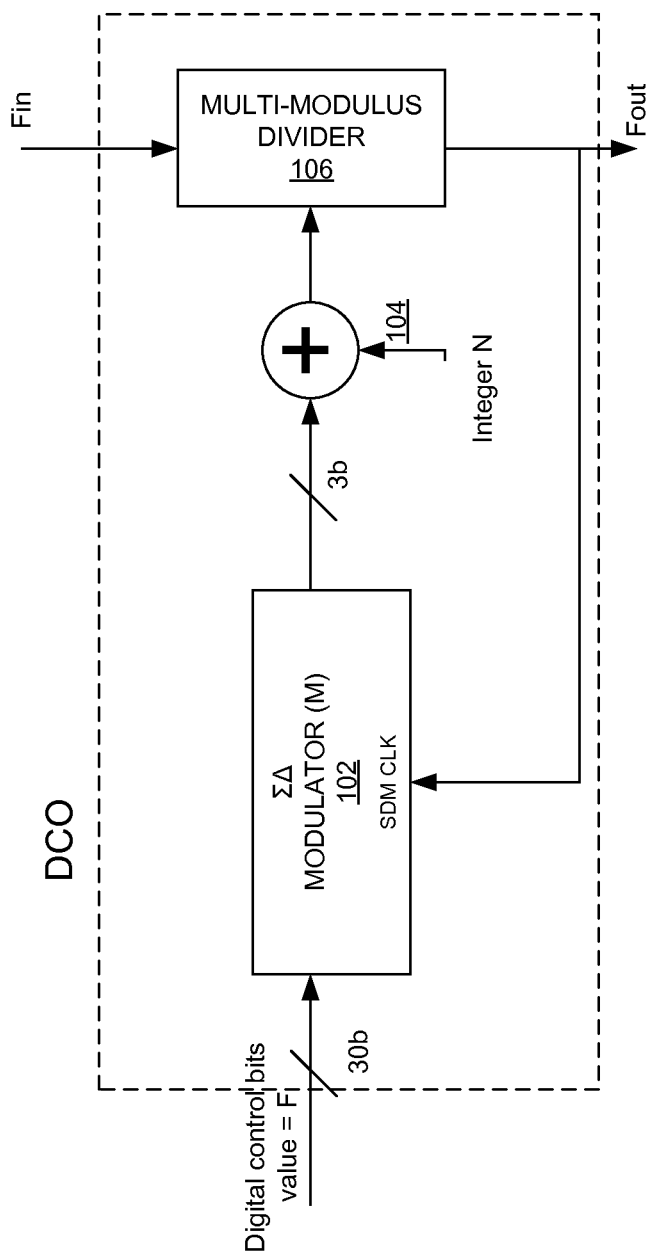
FIG. 1 illustrates a digitally-controlled oscillator (DCO) according to an exemplary embodiment of the present invention.

FIG. 1 illustrates a digitally-controlled oscillator 100 (DCO) according to an exemplary embodiment of the present invention. The DCO 100 may include a sigma delta modulator (SDM) 102, an adder 104, and a multi-modulus divider (MMD) 106. The SDM 102 may generate a digital control output to the adder 104. The adder 104 may add an externally supplied integer value N to the control output from the SDM 102 to generate an integer control word to the MMD 106. The control word may vary among a variety of integer values as determined by the SDM output but, over a predetermined period of time, the control word may have an average value of N+F/M, where N is the externally-supplied integer and F/M is the average value of the SDM output. The MMD 106 may receive an input clock signal $F_{in}$ and generate a frequency-divided output clock signal $F_{OUT}$ according to the values output from the adder 104. Although the instantaneous operation of the MMD is that of an integer divider, over time, the frequency of the output clock take the form $F_{out}=F_{in}/(N+F/M)$.

In the exemplary embodiment illustrated in FIG. 1, the SDM 102 may receive a 30 bit control word F that governs its operation. The SDM is shown as outputting a 3 bit integer value to the adder, which may take values of −1, 0, 1 and 2, for example. However, the SDM 102 is not limited to the particular 30 to 3 bit conversion. As illustrated, the $F_{OUT}$ clock generated by the DCO 100 may be input to the SDM 102 as a driving clock to a system circuit.

Figure 2:
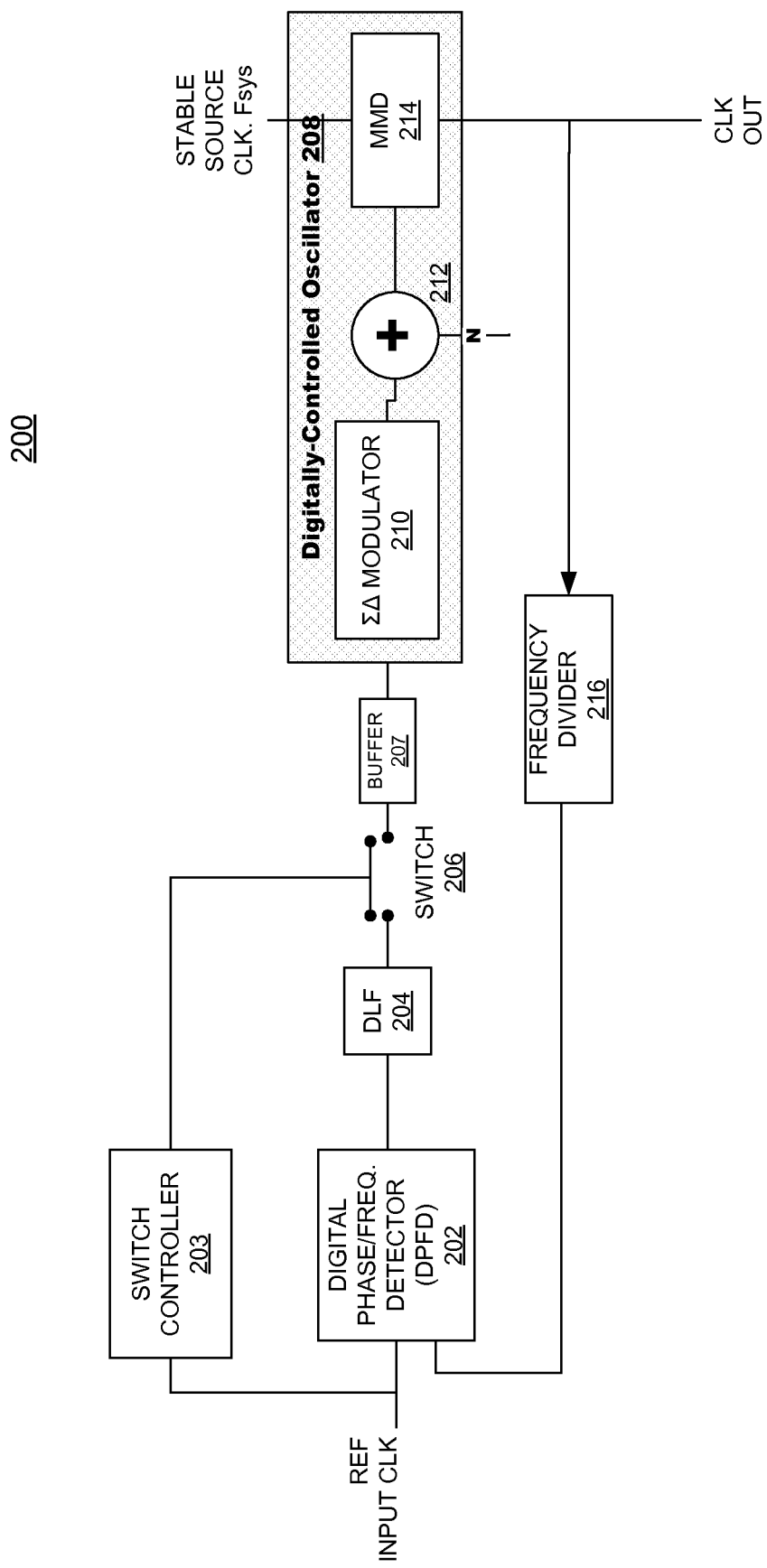
FIG. 2 illustrates a clock system according to an exemplary embodiment of the present invention.

FIG. 2 illustrates a clock generator 200 according to an embodiment of the present invention. The clock generator 200 may include a forward signal path and a feedback signal path to form a signal loop. Along the forward signal path, the clock generator may include a digital phase/frequency detector (DPFD) 202, a digital loop filter (DLF) 204, a buffer 207, and a digitally-controlled oscillator (DCO) 208. Along the feedback signal path, the clock system may include a frequency divider 216. The DCO may include a sigma delta modulator (SDM) 210, an adder 212, and a multi-modulus divider (MMD) 214. The clock generator 200 may also include a switch 206 and a switch controller 203.

The DPFD 202 may include two input terminals with a first input terminal receiving a reference input clock and a second input terminal receiving a feedback signal from the feedback signal path. The DPFD 202 may compare the reference input clock with the feedback signal to calculate a difference signal representing the phase and/or frequency differences between the two input signals of DPFD 202. The DLF 204 coupled to an output terminal of DPFD 202 may normally receive and perform low-pass filtering of the difference signal to generate control bits. The DLF 204 may be coupled to a buffer 207 via a switch 206. The buffer 207 may be a data storage device that is capable of persistently holding the control bits even at times when the forward signal path is cut off. The buffer 207 may store variations of the output from DLF 204. For example, the buffer 207 may store the current one of the control bits or an average of control bits over a predetermined time period.

The DCO 208 may have a control input terminal coupled to the buffer 207 for receiving the control bits stored in the buffer and a clock input terminal coupled to a stable source clock $F_{sys}$. Within the DCO 208, the SDM 210 may be coupled to the control input terminal for receiving the control bits and generate a digital word pattern based on the supplied control bits where the digital word pattern may have a target average value of F/M. The adder 212 may be coupled to the SDM 210 for receiving the time-averaged control bits and add a constant to the time-averaged control bits. The MMD 214 may have a clock input coupled to the stable source clock $F_{sys}$ and have a control input coupled to the adder 212 for receiving a control word. The MMD 214 may produce a clock output that divides $F_{sys}$ by the number represented by the control word.

The $F_{sys}$ may be a stable source clock in the sense that, during a holdover event when the reference input clock becomes invalid—i.e., when it is lost or out of a specified valid frequency range, $F_{sys}$ still may supply a sustained clock $F_{sys}$ to the DCO 208. The $F_{sys}$ may be supplied from a highly-stable source clock such as a crystal oscillator (XO), temperature-compensated XO (TCXO), or an oven-controlled XO (OCXO). Under certain circumstances, the $F_{sys}$ may be synthesized from a highly-stable source clock using an internal frequency multiplier to achieve a high frequency stable source clock. As such, the control bits from the buffer of the DLF 204 may tune the DCO 208 (or provide frequency adjustments) for generating an output clock for the clock system.

The feedback signal path may include a frequency divider 216 provided between the output clock and the second input terminal of the DPFD 202. In one example embodiment of the present invention, the frequency divider 216 may be an integer frequency divider (N1) that divides the frequency of the output clock by an integer N1. Alternatively, the frequency divider 216 may be a fractional frequency divider that may divide the frequency of the output clock by a fractional number. The output clock may be supplied through the feedback signal path to the DPFD 202 for a comparison with the reference input clock so that the difference between the reference input clock and the output clock may be used to control the DCO 208 during normal operation.

The switch 206 may be provided along the forward signal path in a place before the buffer and be controlled by a switch controller 203 based on the state of the reference input clock. In a preferred embodiment, the switch 206 may be coupled between the DLF 204 and the buffer 207. However, the switch 206 is not limited to this particular location, and it may be placed in other parts of the circuit for the same results. For example, in one embodiment, the switch 206 may be placed between the DPFD 202 and the DLF 204.

Thus, the switch controller 203 may cause the switch 206 be engaged during normal operation when the reference input clock to the first input terminal of the DPFD 202 is active. However, if a holdover event arises when the reference input clock becomes invalid, the absence of the reference input clock may cause the switch controller to disengage the switch 206 and thus cut off the forward signal path. However, the control bits stored in the buffer still may maintain their values and supply control bits to the DCO 208. Since the control bits held in the buffer may sustain a supply of stable control bits to the DCO 208, a persistent output clock may be maintained even during a holdover event.

Figure 3:
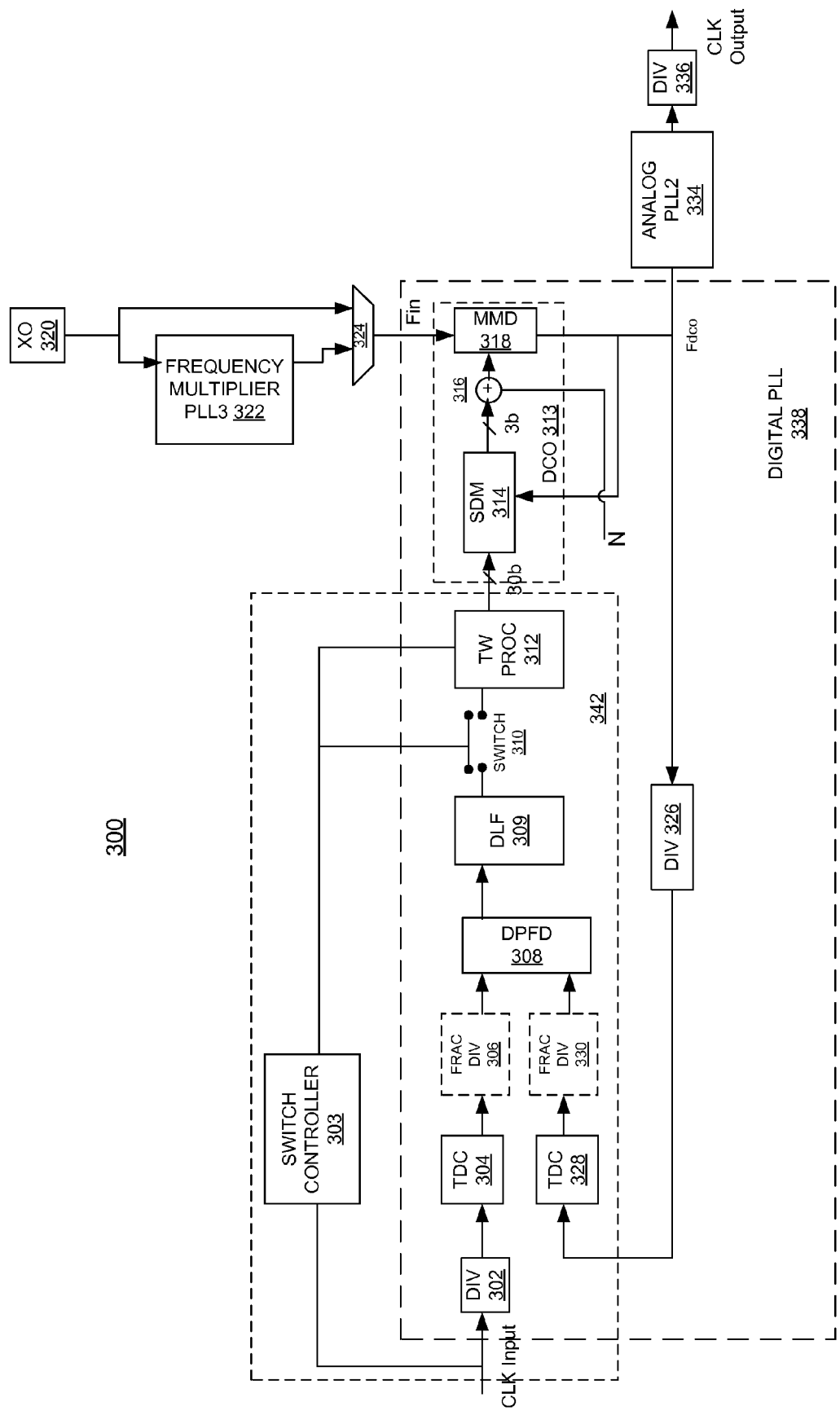
FIG. 3 illustrates another clock system according to an exemplary embodiment of the present invention.

FIG. 3 illustrates another clock system according to an embodiment of the present invention. The clock system 300 may include a forward signal path and a feedback signal path to form a loop. The output of the loop formed by the forward and feedback signal paths may be a persistent clock signal ($F_{dco}$). Additionally, the clock system 300 may include an analog PLL (analog PLL2) to filter the $F_{dco}$ to remove jitter contained in the $F_{dco}$.

The forward signal path of the clock system may include a first integer frequency divider 302, a time-to-digital converter (TDC) 304, and a digital phase and frequency detector (DPFD) 308. The forward signal path further may include a digital loop filter (DLF) 309, a switch 310, a tuning word processor 312, and a DCO 313 as described in FIG. 1 (with different labels) which may include a sigma delta modulator (SDM) 314, an adder 316, and multi-modulus divider (MMD) 318. The switch 310 may be controlled by a switch controller 303 based on whether the reference input clock is available or not. The switch controller 303 also may supply a control signal to the tuning word processor 312 to control its operation. The feedback signal path may include a second integer frequency divider 326 and a second time-to-digital converter (TDC) 328. The clock system 300 also may include a crystal oscillator (XO) 320, an alternative frequency multiplier (PLL3) 322, and a multiplexer 324 together to provide a stable source clock. The clock system also may include an analog PLL (PLL2) 334 and a frequency multiplier 336 for filtering and frequency multiplication of the final output clock.

Along the forward signal path from upstream to downstream, the first integer frequency divider 302 may be coupled to a reference input clock for dividing the frequency of the reference input clock by a predetermined integer value. The first TDC 304 coupled to the first integer frequency divider 302 may convert the reference input clock to a digital reference input clock. The DPFD 308 may have two input terminals for receiving two digital signals to be compared at the DPFD 308. The first input terminal of the DPFD 308 may be coupled to the first TDC 304, and the second input terminal of the DPFD 308 may be coupled to the feedback signal path to receive a feedback signal. The DPFD 308 may output at an output terminal a difference signal that represents the phase/ frequency difference between the digital reference input clock and the feedback signal. The output of DPFD 308 may be coupled to the DLF 309 that may perform low-pass filtering of the difference signal to generate tuning words as control bits to the DCO 313.

Figure 4:
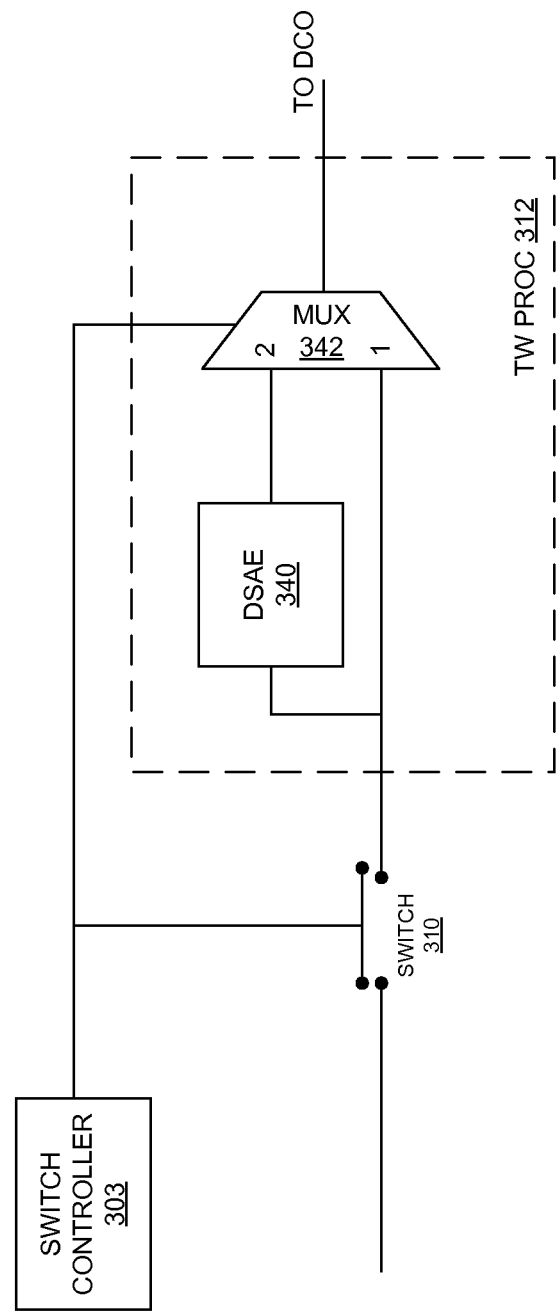
FIG. 4 illustrates a tuning word processor according to an exemplary embodiment of the present invention.

The forward signal path further may include a switch 310 coupled to the output terminal of the DLF 309. The switch 310 may be controlled by the switch controller 303 based on the state of the reference input clock. The switch controller 303 may cause the switch 310 to be engaged during normal operation when the reference input clock is available to the clock system 300. However, if a holdover event arises when the reference input clock becomes invalid, the switch controller 303 may cause the switch 310 to disengage the DLF 309 from the tuning word processor 312. The tuning word processor 312 may be coupled to the switch 310 opposite to the output of the DLF 309. The tuning word processor 312 may be a controller device that may be configured with functionalities. FIG. 4 illustrates an example tuning word processor according to an exemplary embodiment of the present invention. Referring to FIG. 4, the tuning word processor 312 may include a data storage and average element (DSAE) 340 and a multiplexer 342. In one embodiment, the DSAE 340 may be a memory that stores output from DLF 309 and/or computes the average of the DLF output over a time period. A data input of the tuning word processor may be externally coupled to the switch 310 and internally to an input of the DSAE 340 and a first input of the multiplexer 342. The output of the DSAE 340 may be coupled to a second input of the multiplexer 342. The tuning word processor 312 also may have a control input that may externally coupled to the switch controller 303 for receiving the control signal and internally to the control pin of the multiplexer 342. Thus, during normal operation, the switch controller 303 may cause the switch 310 engaged and the output of the multiplexer 342 connected to its first input. In this way, the output of DLF may be directly fed to the DCO, and at the same, stored and/or averaged at the DSAE 340. However, if a holdover event arises, the switch controller 303 may cause the switch 310 disengaged and at about the same time, the output of the multiplexer 342 connected to its second input. In this way, the forward signal path is cut off by the disengaged switch 310. However, the DCO may still receive the stored or average control bits stored in the DSAE 340 through the second input of the multiplexer 342.

The tuning word processor 312 also may be provided to tailor response of the DCO 313 based on the filtered error. For example, a variety of non-linear response curves may be loaded into the DSAE 340 of the tuning word processor 312 to effect a desired response. In this regard, the DSAE 340 may store one or more conversion tables, which may be indexed by the filtered error signal from the DLF 309. Also, the tuning word processor 312 may include a processor (not shown) configured with an algorithm to directly compute the response from the filtered errors from the DLF 309.

The DCO 313 as similarly described above in conjunction with FIG. 1 may be coupled to the tuning word processor 312. The SDM 314 of the DCO 313 may receive the control bits and modulate the control bits to produce a modulated control bits (F/M) which may be added by an integer N at the adder 316 to generate a control bit of (F/M+N) for the MMD 318. The MMD 318 of the DCO 313 also may receive a stable source clock that may not be interrupted during holdover events. The stable XO 320 may generate a clock signal which may be frequency multiplied by PLL3 322 or which alternatively may be fed directly to the multiplexer 324 through which the stable source clock $F_{in}$ may be supplied to the MMD 318. The output of the DCO 313 $F_{dco}$ (or the output of the forward-and-feedback loop) may be controlled by the control bits, or $F_{dco}=F_{in}/(F/M+N)$.

The feedback signal path may be coupled between the output terminal of the DCO 313 and the second input terminal of the DPFD 308. Along the feedback signal path, a second integer frequency divider 326 may be coupled to the output of the DCO 313 to divide the frequency of $F_{dco}$ by an integer. A second TDC 328 may be coupled to the second integer frequency divider for converting the clock $F_{dco}$ into a digital feedback clock signal.

In one example embodiment of the present invention, an optional first fractional frequency divider 306 may be provided between the first TDC 304 and the DPFD 308, and an optional second fractional frequency divider 330 may be provided between the second TDC 330 and the DPFD 308.

During normal operation, the reference input clock may be supplied to the forward signal path of the clock system. The DPFD 308 may compare the frequency and/or phase differences between the reference input clock and feedback signals to generate a digital difference signal which may be converted into a sequence of tuning words (TW1) by the DLF 309. The switch 310 may be engaged so that the output of DLF 309 may be directly supplied to the tuning word processor 312. The tuning word processor 312 may normalize TW1 to generate the control bits (TW2). The output buffer of the tuning word processor 312 may be updated periodically with new control bits (TW2) based on the difference signal. The control bits may determine the frequency ratio between $F_{dco}$ and $F_{in}$ according to $F_{dco}=F_{in}/(N+F/M)$ where F is the control bits TW2. $F_{dco}$ may at one hand provide the feedback signal via the second integer frequency divider 326, the second TDC 328, and optionally the second digital frequency fraction divider 330 to the DPFD 308 for comparing with the reference input clock. $F_{dco}$ also may, through an analog PLL2 and a frequency multiplier 334, provide a system clock to a circuit system (not shown). The analog PLL2 334 may include a high frequency voltage-controlled oscillator (VCO) to scale up the DCO output to a higher frequency. The analog PLL2 334 also may provide noise filtering to the DCO output.

If a holdover event arises, the reference input clock may be lost. The loss may cause the switch controller 303 to disengage the switch 310 to cut off the forward signal path. However, the DSAE 340 of the tuning word processor 312 may keep its current control bits (or an average of the stored control bits) and provide stable control bits to the DCO 313 so that the DCO output $F_{dco}$ still may be stable and accurate. Since the control bits are stored digitally, they are highly stable and less sensitive to temperature variations. In this way, the clock system 300 may provide a persistent and accurate $F_{dco}$ even during holdover events.

The foregoing embodiments provide a clock generation system that performs frequency conversion of a reference clock signal at a variety of non-integer conversion factors and is operable even during holdover events in which the reference clock temporarily becomes invalid. Moreover, the clock system can be fabricated on a common integrated circuit with a reduced amount of external components such as external filters. Thus, the clock system generates an accurate clock with low integration costs when the clock is integrated with other processing systems (not shown).

Figure 5:
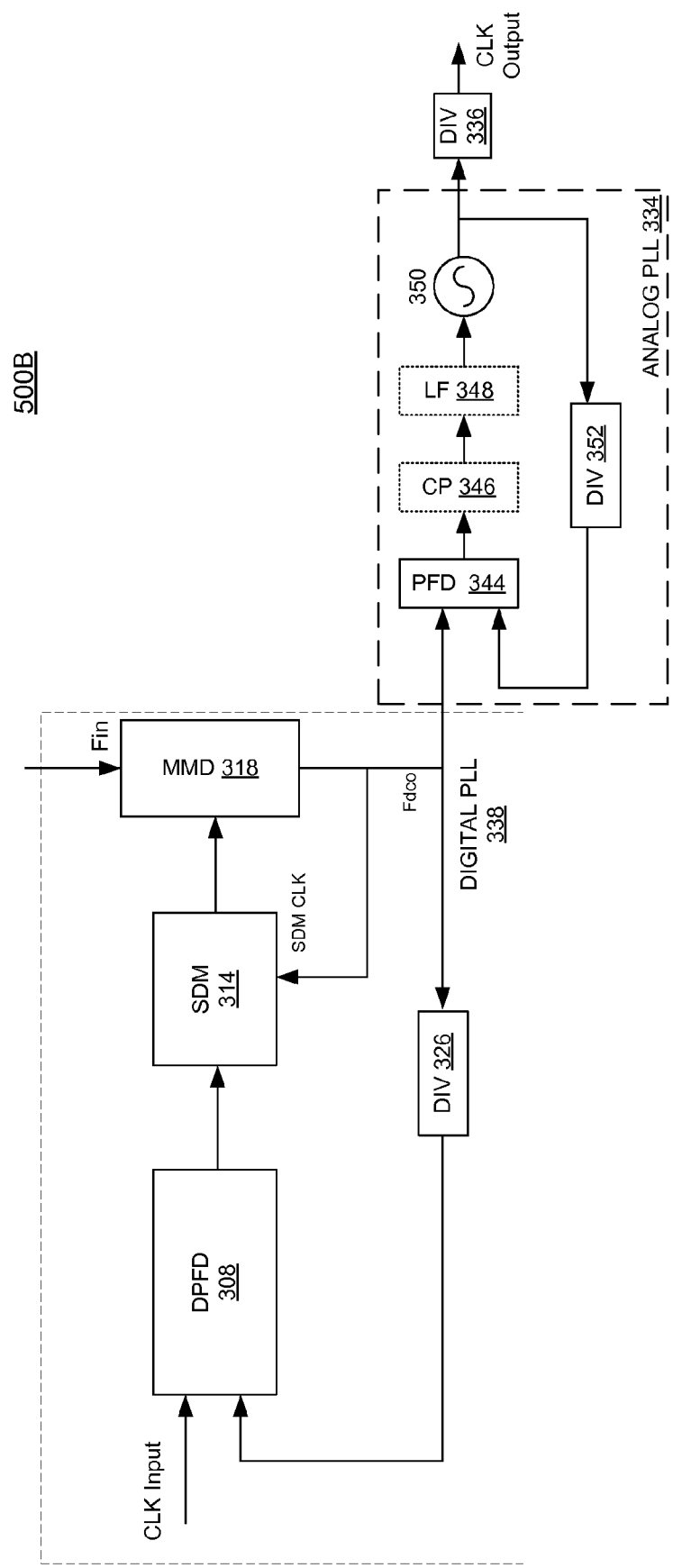
FIG. 5 is an alternative illustration of the clock system as shown in FIG. 3.

FIG. 5 an alternative illustration of the clock system as shown in FIG. 3. The clock system as illustrated in FIG. 5 may include a digital clock generator (or digital PLL 338) and an analog PLL 334. The digital PLL 338 may include a DPFD 308, an SDM 314, a MMD 318 and a frequency divider 326. Additionally, the digital PLL 338 may include TDC (not shown). The digital PLL 338 may have a forward signal path including serially-connected DPFD 308, SDM 314, and MMD 318 and a feedback signal path including the frequency divider 326, and generate a clock output $F_{dco}$ that is inputted to the feedback signal path and to the analog PLL 334.

The analog PLL 334 may include a PFD 344 and a voltage controlled oscillator (VCO) 350 that may be serially-connected together to form a forward signal path. Optionally, as shown in FIG. 5, the forward signal path may include a charge pump (CP) 346 and a loop filter (LF) 348 coupled between the PFD 344 and VCO 350. A frequency divider 352 coupled from an output of the VCO 350 to a second input of the PFD 344 forms a feedback signal path for the analog PLL 334. The output of the digital PLL 338 may be coupled to a first input of the PFD 344.

In operation, the PFD 344 may receive the output signal $F_{dco}$ from the digital PLL 338 at the first input and a feedback signal at the second input. The PFD 344 may output a difference signal representing a frequency and/or phase difference between $F_{dco}$ and the feedback signal. The CP 346 may convert the difference signal into an appropriate format. The LF 348 may perform low-pass filtering on the difference signal to remove noise components such as those in the high frequency ranges. The output from LF 348 may be used to control the VCO 350 or the frequency of the VCO output signal. The frequency divider 352 may divide the frequency of the VCO output signal by a number N2 (N2 can be an integer or alternatively a fractional number) to provide the feedback signal to the second input of the PDF 344.

As discussed above, the clock output $F_{dco}$ from the digital PLL 338 may have a frequency that, on average, corresponds to the frequency of the input signal divided by a factor of (N+F/M). As such, the $F_{dco}$ may include unfiltered irregularities that correspond to noise components in the high frequency regions. Due to noise aliasing at the frequency divider 326, the high frequency noise in $F_{dco}$ may be aliased down to low frequency regions after passing through the divider 326. Thus, a narrow band loop filter may be needed in the forward signal path of the digital PLL 338 to remove the aliasing noise in the low frequency regions even when the reference clock input is clean and free of noise. In most applications, the aliasing noise may not be an issue when the bandwidth requirement is not very stringent or when a wide bandwidth is acceptable. However, the aliasing noise may cause problems for certain applications where both a wide DPLL bandwidth and a good noise performance are desirable.

Figure 6:
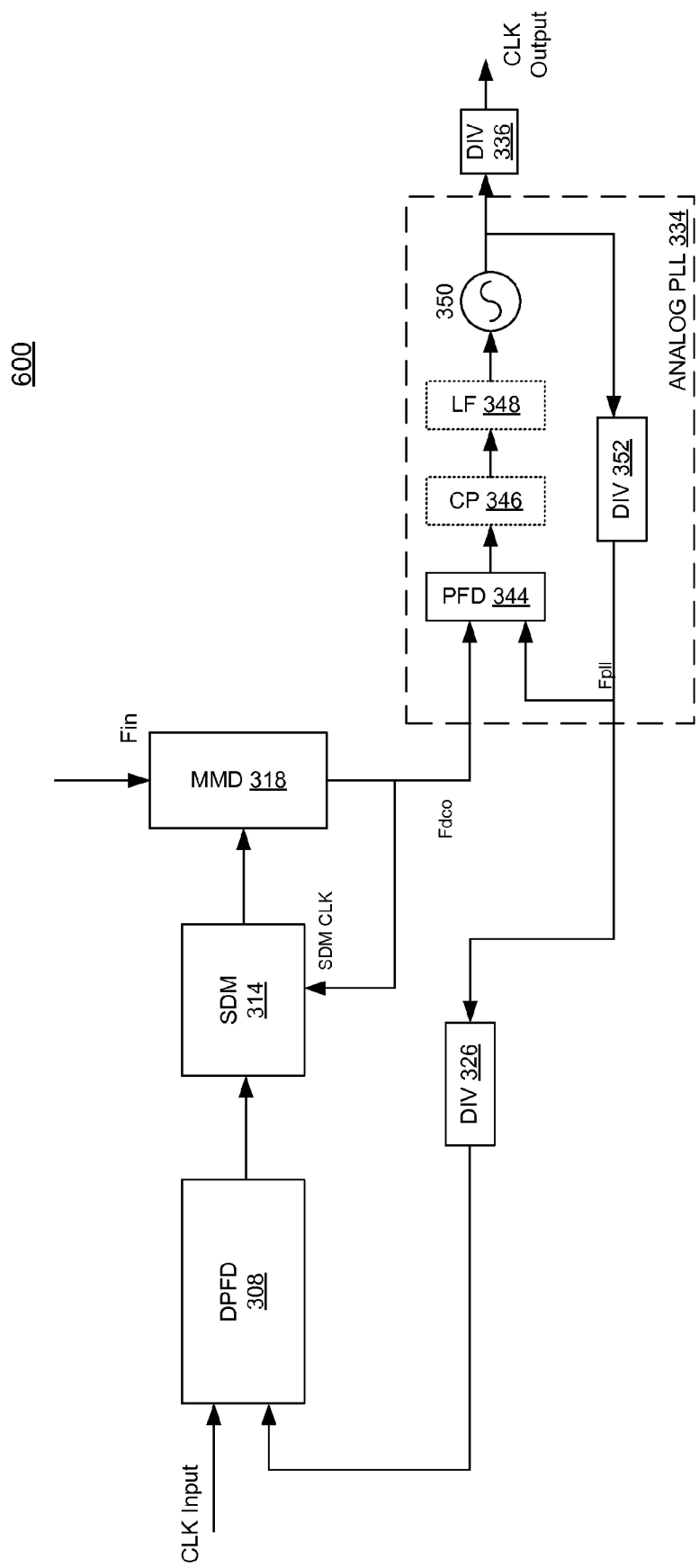
FIG. 6 illustrates a clock system according to an exemplary embodiment of the present invention.

FIG. 6 illustrates a clock system according to an exemplary embodiment of the present invention. In this embodiment, the digital PLL 338 and the analog PLL 334 may together form a signal loop. Thus, the output ($F_{dco}$) of the digital PLL 338 still may be coupled to the first input of PFD 344. However, the frequency divider 326 may be decoupled from $F_{dco}$. Instead, the frequency divider 326 may be coupled to the output of the frequency divider 352 (or the second input of PFD 344) to receive the signal $F_{pll}$ from the divider 352 of the analog PLL 334. The signal $F_{pll}$ may be injected into the feedback signal path of the digital PLL 338 and may be the phase-locked signal to $F_{dco}$. The PFD 344 at its first input still receives $F_{dco}$. Since the first and second inputs of the analog PLL 334 are phase and frequency locked, the $F_{pll}$ may be considered a copy of $F_{dco}$ but with noise components in the high frequency regions being removed by the loop filter 348. Thus, when $F_{pll}$ is frequency divided by the frequency divider 326, the aliasing noise components in the low frequency regions may be substantially reduced to a level that the bandwidth of the loop filter (such as DLF 309 of FIG. 3) in the forward signal path of the DPLL 338 may not be overly narrow. Therefore, the DPLL 338 may have a broader bandwidth and at the same time, still have enhanced noise performance.

Figure 7:
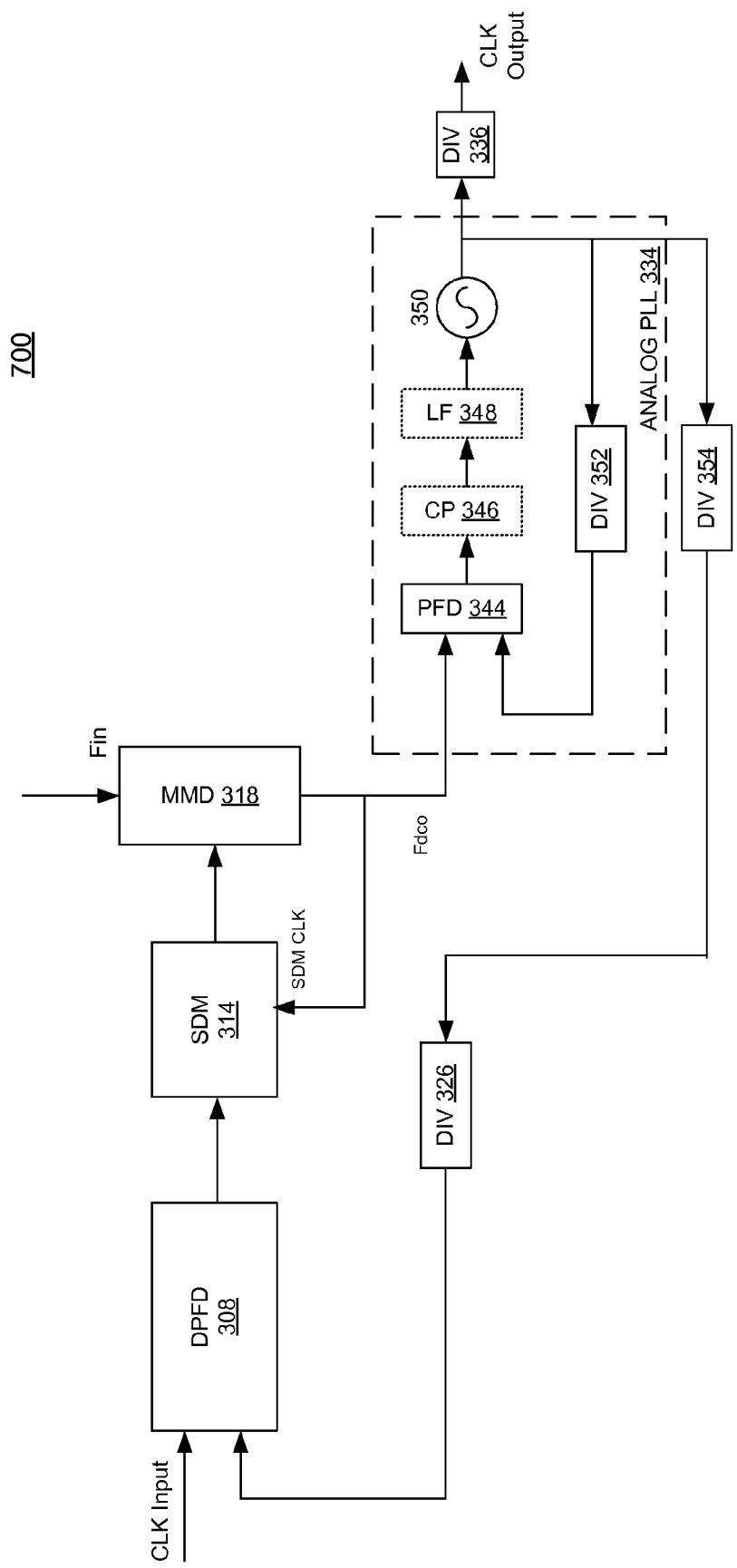
FIG. 7 illustrates another clock system according to an exemplary embodiment of the present invention.

FIG. 7 illustrates another clock system according to an exemplary embodiment of the present invention. In this embodiment, the feedback signal path may be extended to the output of the analog PLL 334 to include an additional frequency divider 354 which is coupled between the output of the analog PLL 334 and the frequency divider 326. Thus, dividers 354 and 326 form a feedback signal path from the output of the analog PLL to the frequency divider 326 to provide a feedback signal to the DPFD 308. In one embodiment, the frequency divider 354 may have a frequency dividing ratio that is substantially identical to that of frequency divider 352. Thus, the performance of the system as shown in FIG. 6 may be substantially similar to the system of FIG. 5. Alternatively, the frequency divider 354 may be different from frequency divider 326. Further (not shown), frequency dividers 326 and 354 may be merged into a single frequency divider that may achieve a combined frequency division as the cascaded frequency dividers 354 and 326.

Figure 8:
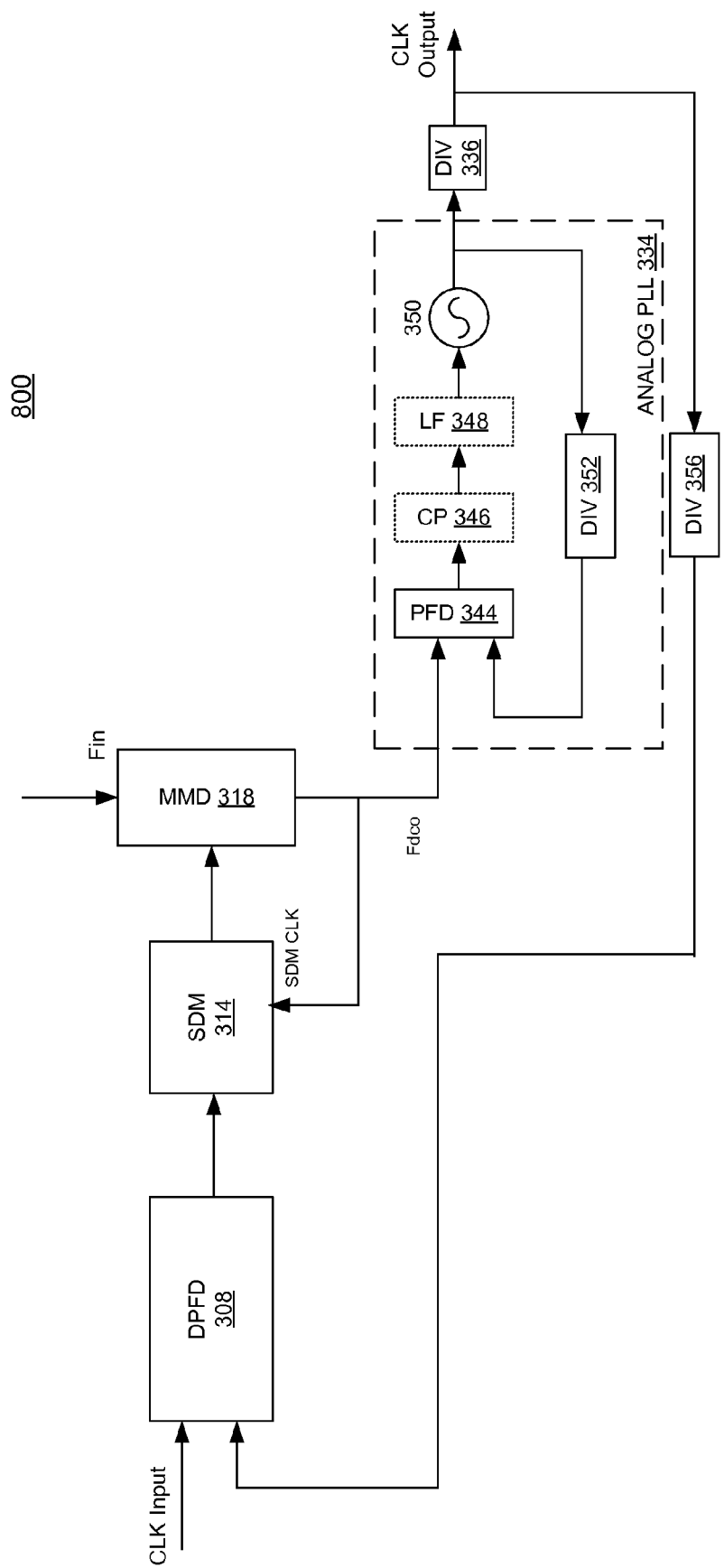
FIG. 8 illustrates another clock system according to an exemplary embodiment of the present invention.

FIG. 8 illustrates yet another clock system according to an exemplary embodiment of the present invention. In this embodiment, the feedback signal path for the clock system include a frequency divider 356 that is coupled between the output of the frequency divider 336 and the second input of the DPFD 308. According to one embodiment of the present invention, the frequency divider 356 may effectively combine the frequency divisions of frequency dividers 354 and 326 of FIG. 7.

FIGS. 6-8 illustrate example systems that inject a phase-locked and less noisy versions of $F_{dco}$ into the feedback signal path that includes the frequency divider 326. Alternatively, the noise in the feedback signal path of the digital PLL 338 also may be removed or compensated in the feedback path directly. These alternative methods may employ noise compensation devices in the feedback signal path of the digital PLL 338.

Figure 9:
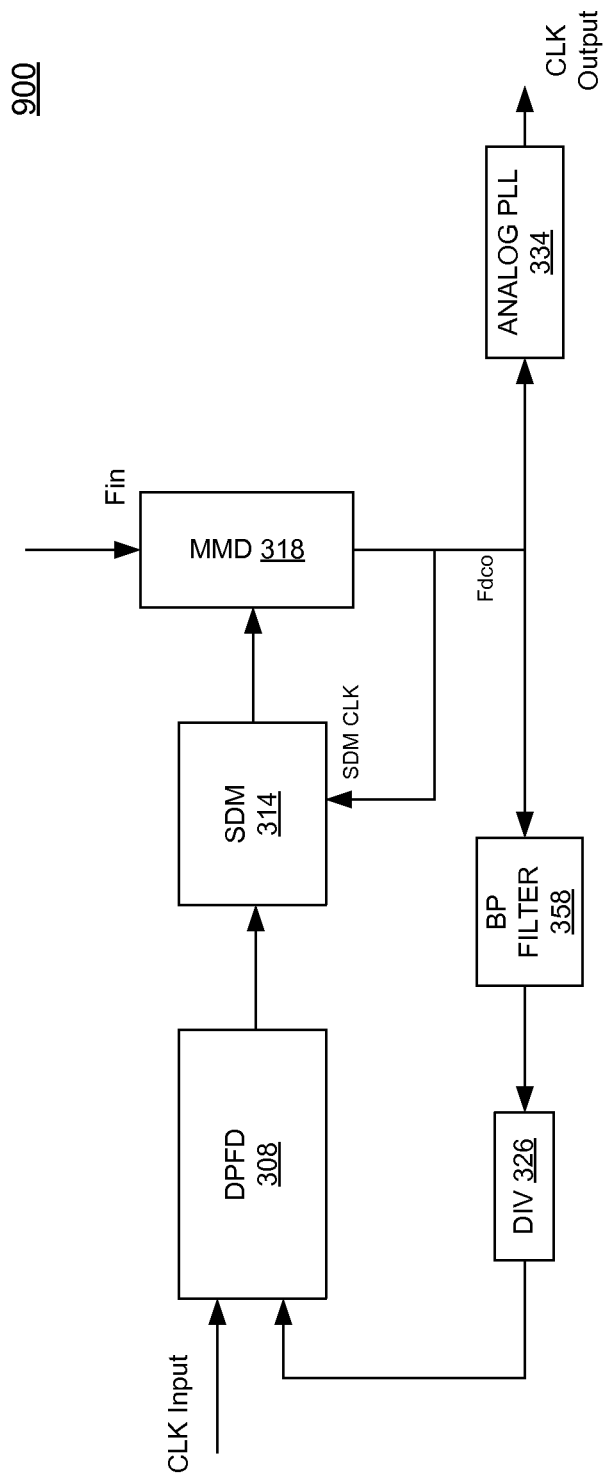
FIG. 9 illustrates a clock system including a band-pass filter according to an exemplary embodiment of the present invention.

FIG. 9 illustrates a clock system including a band-pass filter in the feedback signal path according to an exemplary embodiment of the present invention. In this embodiment, similar to FIG. 5, the feedback signal path is coupled between the digital output $F_{dco}$ and the second input of DPFD 308. However, the feedback signal path may include a band-pass filter 358 that is coupled between the frequency divider 326 and $F_{dco}$. In one embodiment, the band-pass filter 358 may be an RLC passive analog band-pass filter that may be designed to reduce and/or remove the noise components contained in the high frequency range of $F_{dco}$.

Figure 10:
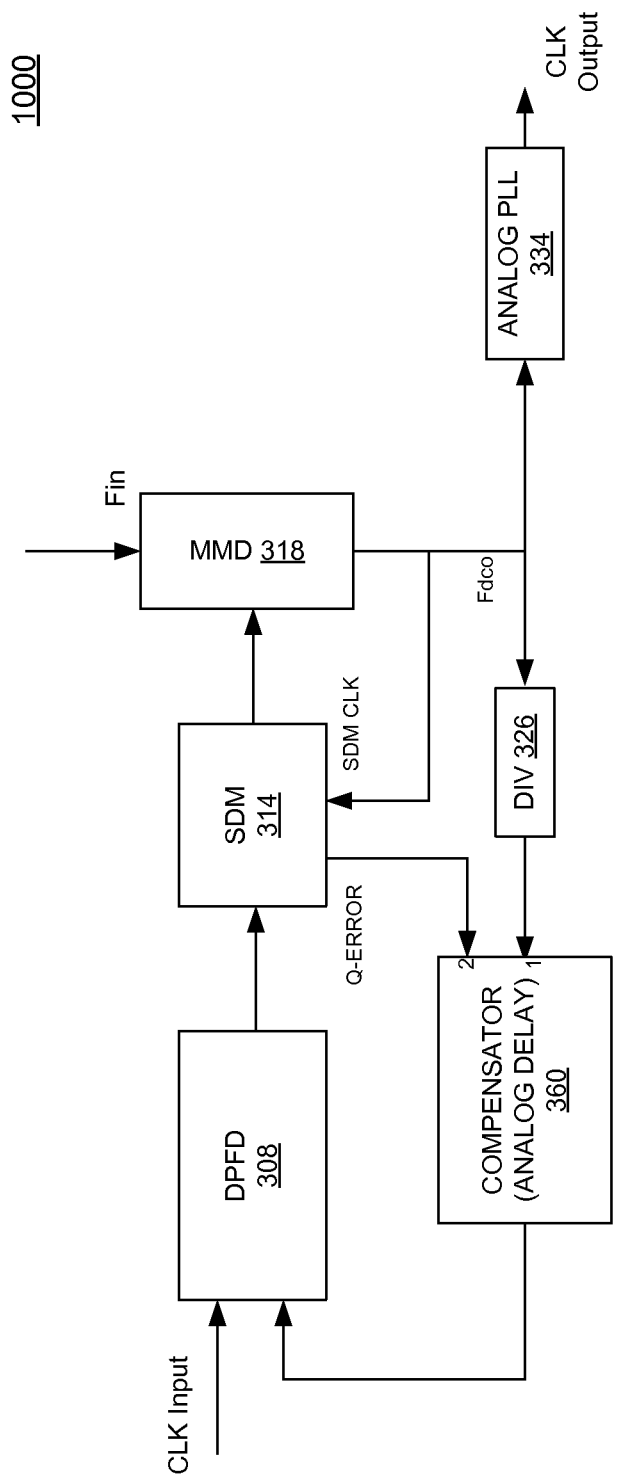
FIG. 10 illustrates a clock system including an analog compensator according to an exemplary embodiment of the present invention.

FIG. 10 illustrates another clock system having an analog compensator in the feedback signal path according to an exemplary embodiment of the present invention. The feedback signal path of the system as shown in FIG. 10 may include an analog compensator 360 and the frequency divider 326. In one embodiment as shown in FIG. 10, the analog compensator 360 may be coupled at a first input to the frequency divider 326 to receive a clock signal and at a second input to the SDM 314 to receive a quantization error signal. The quantization error signal from SDM 314 may represent temporal errors in $F_{dco}$, or deviations between actual signal edges and the ideal signal edge locations of the output $F_{dco}$. The scaled quantization error may be used to compensate the instant irregularities of $F_{dco}$ clock edge locations to minimize the noise in the $F_{dco}$ clock. In one embodiment, the analog compensator 360 may be an analog delay generator that may be controlled by the quantization error signal at its second input. In operation, the analog compensator 360 may add temporal delays to the clock signal from frequency divider 326. The temporal delay may be proportional to a measurement of the quantization error (such as the magnitude of the quantization error) for each corresponding clock cycle. Thus, a large magnitude of quantization error in a clock cycle may cause the analog compensator 360 to add a large delay to the clock cycle, and a small magnitude of quantization may cause the analog compensator 360 to add a small delay.

In an alternative embodiment (not shown), the analog compensator 360 may be directly coupled at its first input to the digital output $F_{dco}$ and at its second input to SDM 314. The output of the analog compensator 360 may be coupled to the input of the frequency divider 326. The analog compensator 360 may insert delays to the clock signals as discussed above except for that the analog compensator 360 may operate at a higher frequency range (such as 200 MHz) since it by-passes the frequency divider 326 and is directly coupled to $F_{dco}$.

Figure 11:
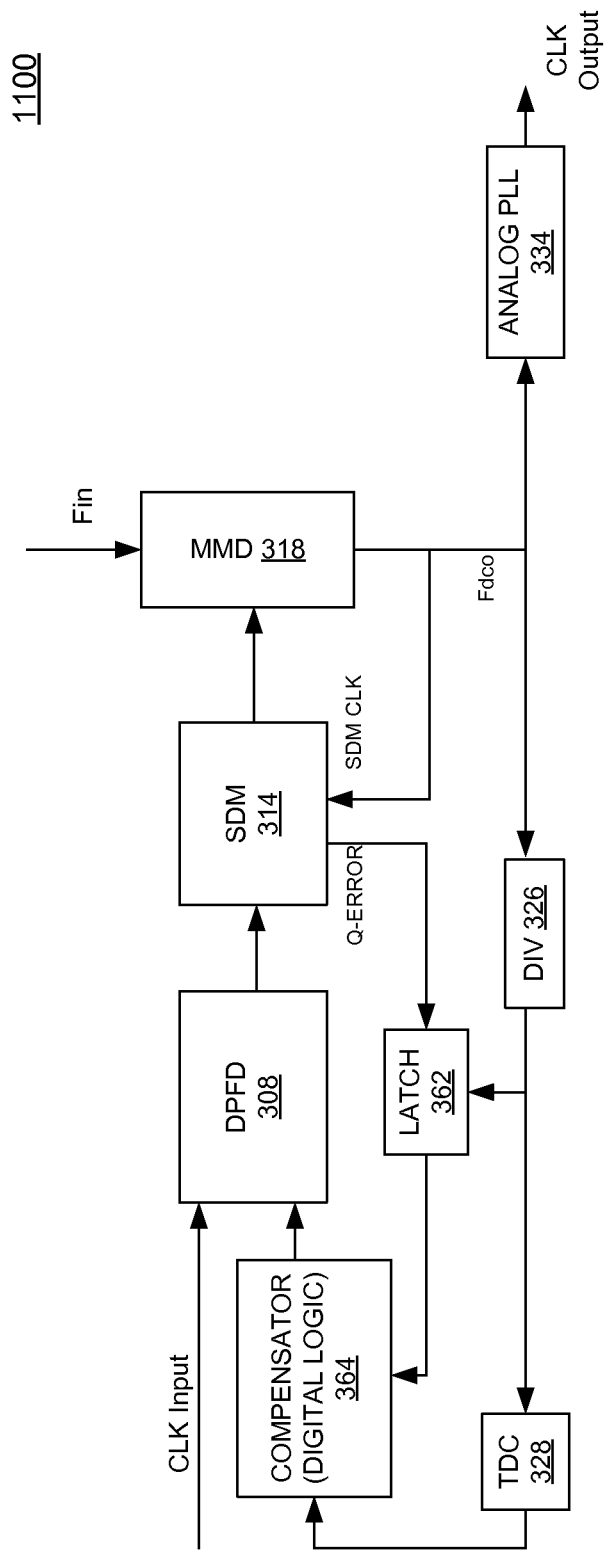
FIG. 11 illustrates a clock system including a digital compensator according to an exemplary embodiment of the present invention.

The embodiment as illustrated in FIG. 10 compensates noise error in the analog domain. Alternatively, the noise error also may be compensated in the digital domain. FIG. 11 illustrates another clock system including a digital compensator in the feedback signal path according to an exemplary embodiment of the present invention. The feedback signal path of the system as shown in FIG. 11 may include a frequency divider 326, a latch 362, a TDC 328 (the same TDC as shown in FIG. 3), and a digital compensator 364. The latch 362 may be coupled at a first input to SDM 314 for receiving a quantization error signal and at a second input to the frequency divider 326 for receiving a frequency sub-sampled sequence of clock $F_{dco}$. The digital compensator 364 at a first input may be coupled to TDC 328 for receiving numerical values representing times of clock edges and at second input to the output of latch 362 for receiving the quantization error for each corresponding clock edge. The clock edges may be up edges or alternatively falling edges. The output of compensator 364 may be coupled to DPFD 308. The latch may include a bank of flip-flops that are designed to capture the quantization error at correct clock cycles and output the quantization errors in the form of digital bits.

In operation, the latch 362 may match the quantization error values from SDM 314 to the output of frequency divider 326 at the corresponding clock edges and provide the matched quantization error to the digital compensator 364. TDC 328 may receive sub-sampled clock edges from frequency divider 326 and output a sequence of numerical values that represent times of the sub-sampled clock edges. These sub-sampled clock edges may be fed into the digital compensator 364. The digital compensator 364 may function as the previously discussed analog compensator 360 to provide delays based on the quantization errors received. However, in this embodiment, digital compensator 364 receives numerical values the represent times. Therefore, the digital compensator 364 may simply be an adder that adds the quantization errors or the quantization errors modified by a scale factor to generate appropriate time delays.

Those skilled in the art may appreciate from the foregoing description that the present invention may be implemented in a variety of forms, and that the various embodiments may be implemented alone or in combination. Therefore, while the embodiments of the present invention have been described in connection with particular examples thereof, the true scope of the embodiments and/or methods of the present invention should not be so limited since other modifications will become apparent to the skilled practitioner upon a study of the drawings, specification, and following claims.

What is claimed is:

1. A clock system, comprising:
a first phase/frequency detector (PFD) having a first input for a reference clock and a second input for a feedback clock, and outputting a difference signal representing a phase and/or frequency difference between the reference clock and the feedback clock;
a buffer coupled to the first PFD to store the difference signal over time;
a digitally-controlled oscillator (DCO) comprising:
a sigma-delta modulator (SDM) having a control input coupled to the buffer,
an adder having inputs coupled to the (SDM) and a source of an integer control word, and
a first frequency divider having a clock input for a source clock signal and a control input coupled to the adder, the first frequency divider generating an output clock as an output clock of the DCO having an average frequency representing a frequency of the source clock signal divided by (N+F/M), wherein M is a modulus of the SDM;
a phase-locked loop (PLL) including a second PFD that has a first input to receive the output clock of the DCO and a second input that is phase-locked to the first input; and
a second frequency divider coupled from the second input of the second PFD of the PLL to the second input of the first PFD.

2. The clock system of claim 1, wherein the second frequency divider is an integer frequency divider or a fractional frequency divider.

3. The clock system of claim 1, wherein the source clock is an active input to the DCO even at times when the reference clock is invalid.

4. The clock system of claim 1, further comprising: a signal detector to identify times when the reference clock is invalid, wherein the buffer is coupled to the first PFD via a switch that, under control of the signal detector, disengages the buffer from the first PFD when the reference clock is invalid.

5. The clock system of claim 4, wherein when the switch disengages the buffer from the first PFD, the buffer holds the then-current value stored in the buffer or an average value of stored values over a predetermined period of time.

6. The clock system of claim 1, wherein a signal at the second input of the second PFD is a copy of the signal at the first input of the second PFD except for a noise component.

7. A clock system, comprising:
a first phase/frequency detector (PFD) having a first input for a reference clock and a second input for a feedback clock, and outputting a difference signal representing a phase and/or frequency difference between the reference clock and the feedback clock;
a buffer coupled to the first PFD to store the difference signal over time;
a digitally-controlled oscillator (DCO) comprising:
a sigma-delta modulator (SDM) having a control input coupled to the buffer,
an adder having inputs coupled to the (SDM) and a source of an integer control word, and
a first frequency divider having (1) a clock input for receiving an external clock signal and (2) a control input coupled to the adder, the DCO generating an output clock having an average frequency representing a frequency of the source clock signal divided by (N+F/M), wherein M is a modulus of the SDM;
a phase-locked loop (PLL) including a second PFD that has a first input to receive the output clock of the DCO and a second input that is phase-locked to the first input; and a second frequency divider coupled from an output of the PLL to the second input of the first PFD.

8. The clock system of claim 7, wherein the source clock is an active input to the DCO even at times when the reference clock is invalid.

9. The clock system of claim 7, further comprising: a signal detector to identify times when the reference clock is invalid, wherein the buffer is coupled to the first PFD via a switch that, under control of the signal detector, disengages the buffer from the first PFD when the reference clock is invalid.

10. The clock system of claim 9, wherein when the switch disengages the buffer from the first PFD, the buffer holds the then-current value stored in the buffer or an average value of stored values over a predetermined period of time.

11. The clock system of claim 7, further comprising a third frequency divider coupled between the output of the PLL and the second frequency divider.

12. The clock system of claim 11, wherein the third frequency divider outputs a clock to an external system.

13. A clock system, comprising
a digital phase/frequency detector (DPFD) having a first input for a reference clock, a second input for a feedback clock, the DPFD generating an output representing a difference between the reference clock and the feedback clock;
a buffer coupled to the DPFD for storing the difference signal over time;
a digitally-controlled oscillator (DCO) comprising
a sigma-delta modulator (SDM) having a control input coupled to the buffer,
an adder having inputs coupled to the (SDM) and a source of an integer control word, and
a first frequency divider having a clock input for a source clock signal and a control input coupled to the adder, the DCO generating an output clock signal having an average frequency representing a frequency of the source clock signal divided by (N+F/M), wherein N is determined by the integer control word and F/M is determined by an output of the SDM;
a second frequency divider coupled to the DCO output clock signal outputting the feedback clock to the DPFD; and
a latch having a first input coupled to the second frequency divider and a second input coupled to the SDM to receive quantization errors, a time to digital converter (TDC) having an input coupled to the first input of the latch, and a compensator having a first input coupled to the TDC for receiving values representing clock edge times and a second input coupled to the latch for receiving quantization errors, wherein the compensator modifies the received values representing clock edge times based on the quantization errors.

14. The clock system of claim 13, further comprising a band-pass filter coupled between an output of the DCO and the second frequency divider.

15. The clock system of claim 13, further comprising a compensator having a first input coupled to the second frequency divider and a second input coupled to the SDM for receiving quantization errors, and an output to the DPFD, wherein the compensator generates a time delay to a clock signal from the second frequency divider based on the quantization errors.

16. The clock system of claim 13, wherein the second frequency divider is an integer frequency divider or a fractional frequency divider.

17. The clock system of claim 13, wherein the source clock is an active input to the DCO even at times when the reference clock is invalid.

18. The clock system of claim 13, further comprising: a signal detector to identify times when the reference clock is invalid, wherein the buffer is coupled to the DPFD via a switch that, under control of the signal detector, disengages the buffer from the DPFD when the reference clock is invalid.

* * * * *